(12) United States Patent
Schiller et al.

(10) Patent No.: US 7,541,070 B2
(45) Date of Patent: Jun. 2, 2009

(54) METHOD OF VAPOR-DEPOSITING STRIP-SHAPED SUBSTRATES WITH A TRANSPARENT BARRIER LAYER MADE OF ALUMINUM OXIDE

(75) Inventors: Nicolas Schiller, Stolpen Ot Helmsdorf (DE); Steffen Straach, Dresden (DE); Mathias Räbisch, Hohnstein Ot Hohburkesdorf (DE); Matthias Fahland, Heidenau (DE); Christoph Charton, Dresden (DE)

(73) Assignee: Fraunhofer Gesellschaft zur Foerderung der angewandten Forschung e.V., Munich (DE)

( * ) Notice: Subject to any disclaimer, the term of this patent is extended or adjusted under 35 U.S.C. 154(b) by 34 days.

(21) Appl. No.: 10/536,329

(22) PCT Filed: Oct. 16, 2003

(86) PCT No.: PCT/EP03/11477

§ 371 (c)(1),
(2), (4) Date: Nov. 17, 2005

(87) PCT Pub. No.: WO2004/050945

PCT Pub. Date: Jun. 17, 2004

(65) Prior Publication Data

US 2006/0257585 A1    Nov. 16, 2006

(30) Foreign Application Priority Data

Nov. 29, 2002 (DE) ................... 102 55 822

(51) Int. Cl.
*H05H 1/24* (2006.01)
(52) U.S. Cl. ............... 427/576; 428/469; 204/192.26
(58) Field of Classification Search .......... 427/248.1, 427/576; 428/469, 613
See application file for complete search history.

(56) References Cited

U.S. PATENT DOCUMENTS 5,178,967 A * 1/1993 Rosenfeld et al. .......... 428/697

| | | | |
|---|---|---|---|
| 5,462,602 A * | 10/1995 | Misiano et al. | 118/718 |
| 5,792,550 A | 8/1998 | Phillips et al. | |
| 5,846,608 A | 12/1998 | Neumann et al. | |
| 5,993,622 A | 11/1999 | Szczyrbowski et al. | |
| 6,492,026 B1 * | 12/2002 | Graff et al. | 428/411.1 |
| 6,576,294 B1 | 6/2003 | Phillips et al. | |
| 2003/0211261 A1 | 11/2003 | Phillips et al. | |

FOREIGN PATENT DOCUMENTS

| | | | |
|---|---|---|---|
| DE | 43 43 040 | * | 1/1995 |
| DE | 43 43 040 C1 | | 1/1995 |
| DE | 44 12 906 C1 | | 7/1995 |
| DE | 44 27 581 A1 | | 2/1996 |
| DE | 195 43 781 A1 | | 5/1997 |
| DE | 198 45 268 | * | 1/2000 |
| DE | 198 45 268 C1 | | 1/2000 |
| EP | 0 437 946 | * | 7/1991 |
| EP | 0 460 966 | | 12/1991 |
| EP | 0 555 518 B1 | | 1/1997 |
| EP | 0 437 946 B1 | | 4/1997 |
| EP | 0 812 779 A2 | | 12/1997 |
| EP | 0 695 815 B1 | | 4/1998 |
| EP | 1 298 229 | | 4/2003 |
| GB | 2 236 278 | | 4/1991 |
| JP | 62-103359 A | | 5/1987 |

OTHER PUBLICATIONS

Schiller et al, New coatings on metal sheets and strips produced using EB PVD technologies, Surface and Coatings Technology 125 (2000), p. 240-245.*
Schiller et al., Surface and Coatings Technology 86-87 (1996), pp. 776-782.
Lobig et al., 1998 Society of Vacuum Coaters, 41st Annual Technical Conference Proceesings (1998), pp. 502-503.
English language abstract of DE 198 45 268.

* cited by examiner

*Primary Examiner*—Timothy H Meeks
*Assistant Examiner*—Elizabeth Burkhart
(74) *Attorney, Agent, or Firm*—Greenblum & Bernstein, P.L.C.

(57) ABSTRACT

The invention relates to a method for vapor-depositing strip-shaped substrates with a transparent barrier layer made of aluminum oxide by reactively vaporizing aluminum and admitting reactive gas in a strip vapor-deposition installation. The invention provides that, before coating with aluminum oxide, a partially enclosed layer made of a metal or of a metal oxide is applied to the substrate by magnetron sputtering.

18 Claims, No Drawings

US 7,541,070 B2

METHOD OF VAPOR-DEPOSITING STRIP-SHAPED SUBSTRATES WITH A TRANSPARENT BARRIER LAYER MADE OF ALUMINUM OXIDE

CROSS-REFERENCE TO RELATED APPLICATIONS

This is a U.S. national phase under 35 U.S.C. § 371 of PCT/EP2003/011477, which was filed on Oct. 16, 2003. Priority is claimed under 35 U.S.C. § 119 to German application DE 102 55 822.1, filed Nov. 29, 2002.

FIELD OF THE INVENTION

The invention relates to a method of vapour-depositing an aluminium oxide barrier layer onto band-like substrates in a vacuum.

BACKGROUND OF THE INVENTION

The coating of preferably band-like substrates with a barrier layer is an important processing step in the manufacture of various packaging materials. In particular polymer materials, after vapour-deposition of a thin metal layer (e.g. aluminium), are further processed to form packaging materials which exhibit a high barrier effect against oxygen and water vapour, possibly also against aromas.

Packaging materials containing a thin metal layer are opaque and exhibit a high microwave absorption, which is disadvantageous for some uses in the field of foodstuff packaging. This is why metallic barrier layers are increasingly being replaced by various oxide-based barrier layers (oxide of Si, Al, Mg).

The reactive evaporation of aluminium from the boat evaporator offers the possibility of combining the advantage of a low evaporation temperature with high optical transparency and a good microwave permeability of the finished product. Methods using electron beam or induction evaporators can also be used.

In barrier coatings of this kind, the optical transmission depends on the mixing ratio of aluminium and its oxide—hereinafter also referred to as stoichiometry. As the oxide content increases, the optical transmission rises, while the barrier effect of the layer is reduced. There is a working area in the slightly hypostoichiometric range whose lower limit is determined by the maximum allowed absorption and whose upper limit is determined by the required minimum values of the barrier [Schiller, N.; Reschke, J.; Goedicke, K.; Neumann, M.: Surface and Coatings Technology, 86-87 (1996) 776-782].

Therefore, it is common practice to make sure that this working area is observed by providing the reactants aluminium and oxygen in a certain adjustable ratio of ingredients (JP 62-103 359 A).

Since the visual evaluation of the finished product plays an important role, especially in the mass packaging field, and minor variations of transmission can be readily recognised, numerous attempts have been made to achieve a uniform transmission across large coating areas; as well as the uniform transmission, in order to achieve a barrier effect one must always strive for a sufficient adhesion of the layer.

It is known that by measuring the optical transmission of the reactively vapour-deposited layers, the process can be controlled by adjusting the evaporation rate such that, with a pre-specified gas flow, a predetermined transmission value is maintained. This is realised in the case of reactive electron beam evaporation (DE 44 27 581 A1). This form of control is not feasible using a boat evaporator, since the evaporator boats are unsuitable for rapid alterations of the heating current and thus for the evaporation rate, and too inert for such a control.

It is further known that by adjusting a certain reactive gas flow that at constant evaporation rates results in weakly absorbing layers, the mixing ratio of the evaporated metal and its oxide can be kept substantially uniform (EP 0 437 946 B1). There is, however, the disadvantage that the process is technologically complex, as—especially when using several evaporator boats—there are high requirements in terms of keeping the evaporation rate constant.

It is further known that aluminium oxide layers can be vapour-deposited in a clearly hypostoichiometric amount. At first, the optical transmission obtained is below the above-mentioned working area. In a secondary oxidation step that is carried out directly after the vapour-deposition (and is plasma-activated) or without any activation during an additional winding operation, the layer is additionally brightened (EP 0 555 518 B1, EP 0 695 815 B1). This additional processing step, however, requires a higher degree of technology.

It is further known that the secondary oxidation (that may be plasma-activated) in the case of a vapour-deposition of very thin, hypostoichiometric oxide layers and a subsequent, relatively long dwelling time in the reactive gas atmosphere spontaneously results in a sufficient brightening of the layer. By using a tape drive which considerably extends the path of the vapour-deposited substrate in the recipient via additional reversing rolls and also allows it to undergo the vapour-deposition cycle several times, sufficiently transparent layers of the usual thickness can be vapour-deposited by superimposing several very thin layers, each subjected to secondary oxidation, by vapour-deposition (U.S. Pat. No. 5,462,602). The method, however, requires a considerably increased extent of mechanical performance at the tape drive.

It is known that barrier layers that, individually, do not meet the minimal requirements concerning their barrier effect, show sufficient barrier effects when used in a multiple layer system. The combination of dusted and vapour-deposited layers is a solution that has also been proposed for aluminium oxide (DE 43 43 040 C1). In this case, the coating is carried out at very different deposition rates. However, the implementation of several successive processing steps causing different processing times also requires a considerably higher degree of technology. In addition, the barrier effect of such layers is often restricted by the fact that different layer stresses are generated in the individual layers; proceeding from the transition areas this can gradually lead to the formation of cracks.

It is further known that good barrier properties can be obtained by implementing the process such that the density of the barrier layer is prevented from falling below a certain limiting value. Therefore, 2.7 g/cm$^3$ is claimed as the lower limiting value of density for aluminium oxide (EP 0 812 779 A2). However, since the density of a vapour-deposition layer strongly depends on the condensation conditions, a preset minimum value is always a considerable restriction in the process implementation. In particular, when retrofitting existing aluminium vapour-deposition facilities for the process of reactively vapour-depositing aluminium oxide layers, the constructive circumstances often determine the condensation conditions, whereby alteration is very costly and can make the conversion as a whole uneconomical. In addition to this, the density of the layer is not a parameter that can be directly measured during the process.

It is further known that the substrate can be provided with a thin nucleation layer having an approximate thickness of 5 nm prior to coating with the actual barrier layer (U.S. Pat. No. 5,792,550). In many cases, this also requires an additional processing step which considerably increases the production costs.

It is further known that the substrate can be treated with a magnetron plasma prior to coating it with the barrier layer [Löbig, G. et al.; SVC 41st Annual Technical Conference Proceedings (1998) S.502]. This gives activates and cleans the substrate surface and improves the adhesion of the layer, thus making the barrier effect less dependent on the stoichiometry of the barrier layer. For many applications, however, the barrier effect obtained in this way is not sufficient either.

Finally it is known that the barrier layer can be vapour-deposited with a stoichiometric gradient (DE 198 45 268 C1). However, the exact adjustment of the stoichiometry in the interface between the layer and the substrate is a very sensitive parameter in such layers.

SUMMARY OF THE INVENTION

It is an object of the invention to provide a method of manufacturing transparent aluminium oxide-based barrier layers on band-like substrates by reactive vapour-deposition without any major technological requirements. In the case of minor variations of the evaporation rate which, especially when using evaporator boats, cannot be completely excluded, the working area determined by the claimed transmission and barrier values is to be maintained without any additional secondary oxidation. The method is also to be practicable for retrofitting existing aluminium vapour-deposition facilities.

The object according to claim 1 is solved according to the invention. Advantageous embodiments of the method are described in claims 2 to 18.

DETAILED DESCRIPTION OF THE INVENTION

The invention is based on the discovery that the barrier effect of an aluminium oxide layer is much less dependent on stoichiometry when the substrate is provided with an ultrathin dusted metal or metal oxide layer prior to the vapour-deposition of the aluminium oxide layer. Ultrathin means a thickness of the layer that does not allow the formation of a closed layer. This is the case when the area occupancy is not enough for the formation of a complete atom or molecule layer, but also slightly higher area occupancies do not result in the formation of closed layers. The dusting process, also called sputtering, cleans and activates the substrate surface, which increases the adhesion of the layer. In addition, the simultaneously sputtered metal atoms or metal oxide molecules exhibit a particularly good adhesion due to the impact energy typical for sputtering processes, as is also known for thicker sputtered layers. It is, however, advantageous that, due to the incomplete covering of the substrate with a layer that is not closed, no layer stresses develop.

Moreover, the substrate areas still uncovered after the sputtering are activated and cleaned and ready for coating with the actual aluminium oxide barrier layer. It has been found that the dependence of the barrier effect on the stoichiometry of the layer is considerably less pronounced when using such a pre-coating than without using it.

Especially good barrier effects can be obtained if a plasma-activated reactive vapour-deposition of the pre-coated substrate with aluminium oxide is carried out afterwards. A dense hollow cathode arc discharge plasma is particularly suitable for plasma activation. Its effect can be further increased by magnetic amplification. This causes an especially low dependence of the barrier effect on the stoichiometry of the layer at constantly good barrier values. Obviously, this particular plasma leads to the formation of a layer structure optimal for barrier layers due to its high charge carrier density. A plasma has been found advantageous that provides an average extractable ion current density of at least 20 mA/cm$^2$ at the substrate. Ion current densities of more than 50 mA/cm$^2$ are especially advantageous.

A particularly advantageous embodiment of the method of the invention is obtained by utilising the fact that the barrier to oxygen does not depend on the stoichiometry to the same extent as the barrier to water vapour. Trials have shown that the extent to which certain depth portions of the layer contribute to the barrier effect of the whole layer depends on the stoichiometry to a different extent.

If the optical transmission of the entire layer is kept constant according to the subsequent requirements for use, the absorption of the various depth portions of the layer may vary. A layer having a stoichiometry uniformly distributed throughout the entire layer thickness cannot be distinguished from a stacked structure made of completely transparent and more hypostoichiometric partial layers. The same applies to layers which, in terms of the stoichiometry, are formed as gradient layers. Different gradients cannot be seen from the measurement of the optical transmission, as long as the absorption of the whole layer does not change.

If a hyperstoichiometric portion is in the vicinity of the substrate, this results in poor barrier values to water vapour and moderate values to oxygen. If the lower portion of the layer contains an hypostoichiometric portion, good water vapour and oxygen barrier values can be obtained.

Therefore, according to the invention, one should strive for hypostoichiometric portions in the lower portion of the layer in the vicinity of the substrate. The other portions of the layer may be hyperstoichiometric. Although those portions also contribute to the oxygen barrier, they have almost no influence on the water vapour barrier. It can be inferred that these portions are also of low density; for this reason the density of the entire layer is hardly significant.

Barrier layers having an excellent barrier effect can be produced by a reactive aluminium evaporation in combination with an activation obtained by a hollow cathode arc discharge plasma and pre-sputtering according to the invention, e.g. by using titanium or magnesium, or in a reactive manner by using the oxide thereof. It is particularly advantageous that both coating steps can be implemented in the same substrate processing time, since the coating rates are in a ratio to each other that is similar to the area occupancies of the not closed sputter layer and the actual barrier layer. Thus, the coating can be carried out in a single run.

The method of the invention consists in the pre-coating of the substrate by reactive or non-reactive sputtering with a not closed layer of a metal or its oxide and the subsequent reactive evaporation of aluminium from a boat evaporator, an induction evaporator, or an electron beam evaporator.

Advantageously, the step of the reactive vapour-deposition is supplemented by a plasma activation, and the reactive gas is introduced such that a suitable partial pressure gradient of the reactive gas is generated along the vapour-deposition zone in the direction of travel of the tape drive.

By using the method of the invention aluminium oxide layers which, in terms of their stoichiometry or the mixing ratio of the evaporated metal and its oxide, are in the form of gradient layers or stacked layers and whose hypostoichiometric portion is in that part of the layer that is close to the substrate, can be vapour-deposited on band-like substrates. In this case, gradient layers have the advantage over stacked structures that they can be vapour-deposited in a single processing step.

The depth portion of the layer showing an absorption in the visible range can be kept very thin, i.e. <10 nm. Since in such thin layers variations of the degree of hypostoichiometry are only visible in the case of pronounced deviations and changes in the hyperstoichiometric ranges—as long as they remain only hyperstoichiometric or at least stoichiometric—do not have any influence on the absorption of the entire layer, the requirements concerning the maintenance of just tolerable absorption are considerably less critical than is the case with layers having a substantially uniform stoichiometry.

When gradient layers are formed, the reactive evaporation can also be carried out using activated plasma, which further improves the barrier properties of the finished product.

The substantial advantage of the method using gradient layers is the extremely low thickness of the hypostoichiometric layer; therefore, a considerable transmission loss occurs only at a very low degree of oxidation, thus eliminating the need for an additional secondary oxidation step in most cases. All other portions of the layer are transparent anyway. In this case the method does not aim at achieving a hypostoichiometry that is as weak as possible but very uniform, but at producing a gradient layer that exhibits a very thin but more hypostoichiometric zone in its lower portion, which makes it much easier to meet the uniformity requirements concerning the optical transmission. The use of the hollow cathode arc discharge plasma according to the invention additionally reduced the dependence of the barrier properties on the stoichiometry of the oxide layer, thus expanding the working area available. An especially high process safety is given when process parameters are controlled. It is particularly advantageous to separately control the respective process parameters for the individual sectors of the vapour-deposition range. Suitable process parameters to be controlled are the amount of aluminium evaporated per time unit and/or the flow of reactive gas. It is particularly advantageous when the control is a transmission-controlled control of the oxygen supply in which the oxygen supply is adjusted such that the optical transmission, which is continuously or periodically measured during the process, is maintained at a set value.

A particularly advantageous embodiment of the method consists in arranging a movable mask in order to limit the vapour-deposition range. It helps to mask hyperstoichiometric portions—e.g. in the lower part of the layer—if they cannot be avoided for constructive reasons.

The invention is described in more detail using an implementation example.

In a known band vapour-deposition facility comprising a recipient with a connected vacuum pump system and a band winding device, the substrate to be vapour-deposited—in this case a PET sheet—passes a magnetron source provided with titanium targets that allows argon and oxygen to enter and serves as a sputtering source. The magnetron source consists of single or double magnetron arrays. The power supplied is adjusted such that a layer that is not closed is formed on the substrate. The area occupancy is below an effective layer thickness of one nanometer. The optimum sputtering performance depends on the band speed used. Power densities of up to 15 W/cm$^2$ target area have been found to be effective at band speeds of approx. 5 m/s. Then the substrate is passed over a cooling roll. Underneath this, the evaporator boats contain the evaporation material that is continuously supplied to the evaporator boats in a known manner and vapour-deposited on the substrate. The evaporator boat is operated at a constant evaporation rate. The effective vapour-deposition range is adjustable by means of a movable mask. Gas inlet nozzles supplying the reactive gas oxygen are arranged on the sides of the vapour-deposition portion between the cooling roll and the evaporator boat. The positions of the gas inlet nozzles and their angles can be adjusted in the direction of the arrows. The reactive gas flow through the gas inlet nozzles near the band intake zone can be manually adjusted. The reactive gas flow through the other gas inlet nozzles is transmission-controlled. The measurement of the optical transmission required for that is carried out by means of known measuring devices outside the vapour-deposition zone, but prior to winding.

If a layer having a stoichiometric gradient is formed, the method of the invention is carried out as follows:

The aluminium vapour-deposition is operated in a known manner. Subsequently, the reactive gas flow at the gas inlet nozzles near the band intake zone is adjusted to between 0 and 40% of the amount of oxygen required in correspondence with the chemical reaction equation for a complete oxidation of the entire layer. Then the controlled gas inlet nozzles on the band discharge side are opened considering the desired nominal value of the optical transmission of 80 to 95%; as a result the reactive gas flow still needed adjusts automatically.

At the beginning of the process or after changes in the positions of the gas inlet nozzles or masks, the reactive gas flow to be adjusted at the gas inlet nozzles is to be detected as follows:

The substrate is vapour-deposited with various adjustments of the reactive gas flow at the gas inlet nozzles. Then the vapour-deposited substrates are measured in terms of their permeation values for water vapour and/or oxygen. Subsequently, the reactive gas flow yielding the lowest permeation value for water vapour and/or oxygen is adjusted at the gas inlet nozzles.

The invention claimed is:

1. A method of vapor-depositing a band-like substrate with a transparent aluminum oxide barrier layer, comprising:
   (i) applying an incompletely closed metal or metal oxide layer to the substrate by magnetron sputtering, the incompletely closed metal or metal oxide layer having a layer thickness of less than one nanometer and applied to have a thickness that is not enough for a complete atom layer or molecule layer; and
   (ii) reactively evaporating aluminum with admission of reactive gas in a band vapor-deposition facility forming a transparent barrier layer of aluminum oxide on the incompletely closed metal or metal oxide layer.

2. A method according to claim 1, wherein titanium or magnesium is sputtered for formation of the incompletely closed layer.

3. A method according to claim 2, wherein the sputtering is carried out in a reactive manner with oxygen admission.

4. A method according to claim 1, wherein the vapor-deposition is plasma-activated.

5. A method according to claim 4, wherein the plasma is activated by means of a hollow cathode arc discharge plasma.

6. A method according to claim 5, wherein the plasma sources are operated such that an average ion flow density of at least 20 mA/cm$^2$ can be extracted at the substrate.

7. A method according to claim 5, wherein the plasma sources are operated such that an average ion flow density of at least 50 mA/cm$^2$ can be extracted at the substrate.

8. A method according to claim 1, wherein
   the admission of the reactive gas is such that a partial pressure of the reactive gas is generated in the vapor-deposition zone in direction of travel of a tape drive; and a mixing ratio of aluminum, aluminum oxide and oxygen in the barrier layer is formed as a gradient, this mixing ratio in the barrier layer has a maximum of content of metallic aluminum, and a position and character of this maximum in a certain depth portion of the barrier layer are adjusted by varying the partial pressure gradient of the reactive gas and a position of the vapor-deposition zone such that oxygen permeation and/or water vapor permeation, at the same optical transmission of the barrier layer, reach their minimum.

9. A method according to claim 8, wherein the position and character of the maximum of metallic aluminum is adjusted in a certain depth portion of the barrier layer by adjusting masks in an evaporation portion and/or changing the position of an evaporator boat and/or changing a position of a gas inlet nozzle and/or an angle of the gas inlet nozzle for the reactive gas and/or changing the reactive gas flows.

10. A method according to claim 9, wherein the partial pressure gradient of the reactive gas is adjusted by variation of the ratio of the reactive gas flows of separately adjustable gas inlet nozzles arranged in an area of the band inlet zone and a band discharge zone.

11. A method according to claim 8, wherein the aluminum from a boat evaporator is evaporated with at least one evaporator boat having continuous wire supply.

12. A method according to claim 8, wherein the aluminum is evaporated from an induction evaporator.

13. A method according to claim 8, wherein the aluminum is evaporated from an electron beam evaporator.

14. A method according to claim 1, wherein process parameters are controlled.

15. A method according to claim 14, wherein the process parameters for individual sectors of the vapor-deposition portion are separately controlled.

16. A method according to claim 14, wherein the process parameters to be controlled are the amount of aluminum evaporated per time unit and/or the reactive gas flow.

17. A method according to claim 14, wherein the control is a transmission-controlled control of the oxygen supply in which the oxygen supply is adjusted such that the optical transmission continuously or periodically measured during the process is kept at a set value.

18. A product formed by the method according to claim 1.

* * * * *